United States Patent
Iwai et al.

(10) Patent No.: US 10,777,440 B2
(45) Date of Patent: Sep. 15, 2020

(54) DETECTION DEVICE, IMPRINT APPARATUS, PLANARIZATION DEVICE, DETECTION METHOD, AND ARTICLE MANUFACTURING METHOD

(71) Applicant: CANON KABUSHIKI KAISHA, Tokyo (JP)

(72) Inventors: Toshiki Iwai, Utsunomiya (JP); Takamitsu Komaki, Utsunomiya (JP); Yasuyuki Unno, Utsunomiya (JP); Nozomu Hayashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/422,701

(22) Filed: May 24, 2019

(65) Prior Publication Data

US 2019/0371642 A1 Dec. 5, 2019

(30) Foreign Application Priority Data

May 31, 2018 (JP) ................................. 2018-104910

(51) Int. Cl.
  *G02B 27/42* (2006.01)
  *H01L 21/68* (2006.01)
  *G01D 5/26* (2006.01)

(52) U.S. Cl.
  CPC ........... *H01L 21/681* (2013.01); *G01D 5/266* (2013.01); *G02B 27/4255* (2013.01)

(58) Field of Classification Search
  CPC ...... G01D 5/38; G01D 5/266; G02B 27/4253; G01B 11/25; G01B 11/2504; G01B 11/2531
  See application file for complete search history.

(56) References Cited

U.S. PATENT DOCUMENTS 5,808,742 A * 9/1998 Everett .................... G03F 9/70
                                                356/401
8,922,786 B2 * 12/2014 Iwai ......................... G01D 5/38
                                                356/499

(Continued)

OTHER PUBLICATIONS

Shaolin Zhou et al.; "Moire Interferometry with High Alignment Resolution in Proximity Lithographic Process;" Applied Optics, Feb. 10, 2014, vol. 53, No. 5, pp. 951-959.

*Primary Examiner* — Jonathan M Hansen
(74) *Attorney, Agent, or Firm* — Canon U.S.A., Inc. IP Division

(57) ABSTRACT

A detection device includes an illumination optical system and a detection optical system. The illumination optical system is configured to illuminate a first diffraction grating having a first period in a first direction and a second diffraction grating having a second period different from the first period. The detection optical system is configured to detect light diffracted by the first and second diffraction gratings. The illumination optical system includes an optical member configured to form, on a pupil plane, a first pole and a second pole opposite to the first pole. The illumination optical system causes lights from the first and second poles to obliquely enter the first and second diffraction gratings from the first direction to illuminate the first and second diffraction gratings. The detection optical system detects diffracted light diffracted by one of the first and second diffraction gratings and by an other diffraction grating.

19 Claims, 11 Drawing Sheets

(56) References Cited

U.S. PATENT DOCUMENTS

2013/0100459 A1* 4/2013 Iwai .................. G01D 5/38
356/499
2016/0116305 A1* 4/2016 Miyazawa ............ G01D 5/266
356/499

* cited by examiner

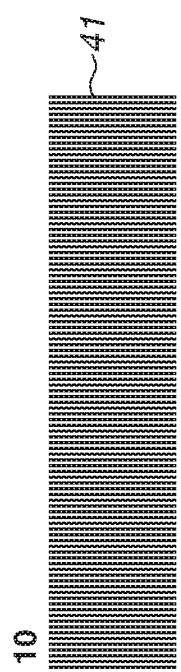
FIG.5A
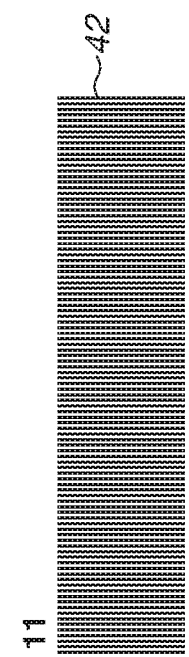
FIG.5B
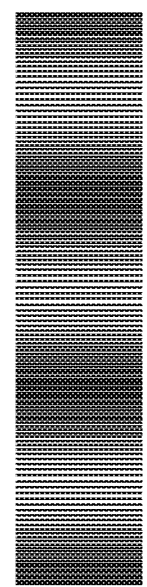
FIG.5C
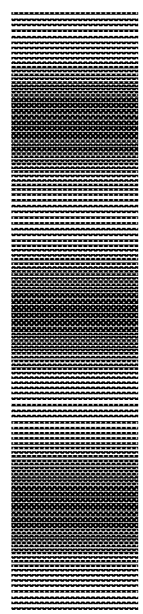
FIG.5D
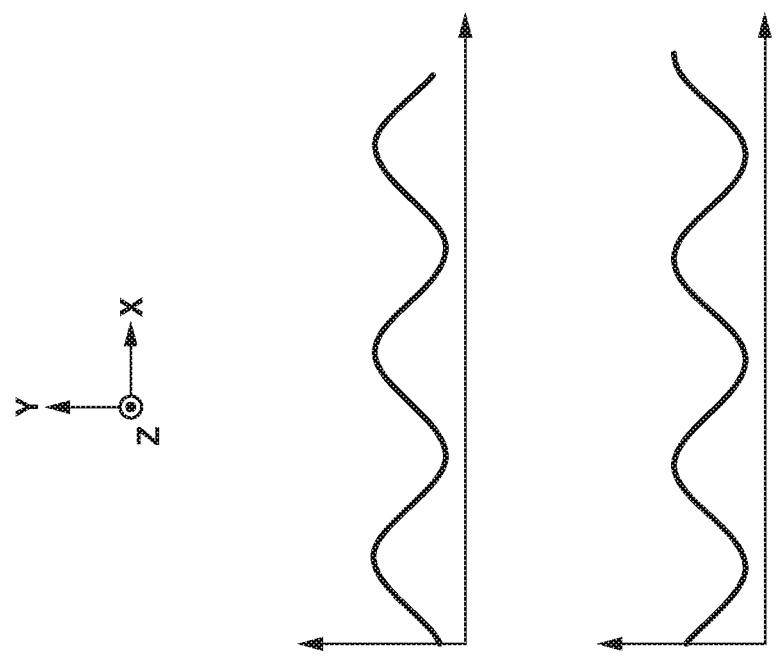
FIG.5E
FIG.5F

DETECTION DEVICE, IMPRINT APPARATUS, PLANARIZATION DEVICE, DETECTION METHOD, AND ARTICLE MANUFACTURING METHOD

BACKGROUND

Field

One disclosed aspect of the embodiments relates to a detection device, an imprint apparatus, a planarization device, a detection method, and an article manufacturing method.

Description of the Related Art

An optical imprint semiconductor manufacturing technology has been known. In this technology, first, a resin layer containing photocurable resin is formed on a substrate (e.g., semiconductor wafer). Next, a mold including a desired concave-convex structure is brought into contact with the resin layer and pressed. Thereafter, ultraviolet rays are radiated to cure the photocurable resin. In this way, the concave-convex structure is transferred to the resin layer. Further, etching and other processes are performed with the resin layer used as a mask to form a desired structure on the substrate. In the manufacture of the semiconductor, alignment of the mold and the substrate is required. For example, under the current circumferences in which the process rule of the semiconductor is 100 nm or lower, an allowable range of alignment error caused by an apparatus is strictly limited to several nanometers to several tens of nanometers.

As a method of aligning the mold and the substrate, there is a method in which a moiré pattern generated by an alignment mark of the mold and an alignment mark of the substrate is detected, and relative position between the alignment marks are determined based on a result of the detection. A method of detecting the moiré pattern in dark field by illuminating one-dimensional diffraction grating, serving as an alignment mark, that has a period in one direction with light obliquely entering only from the one direction, is discussed in Shaolin Zhou, Song Hu, Ynogqi Fu, Xiangmin Xu, and Jun Yang: "Moire interferometry with high alignment resolution in proximity lithographic process", APPLIED OPTICS, 10 Feb. 2014, Vol. 53, No. 5, pp. 951-959.

In the method discussed in Shaolin Zhou, Song Hu, Ynogqi Fu, Xiangmin Xu, and Jun Yang: "Moire interferometry with high alignment resolution in proximity lithographic process", APPLIED OPTICS, 10 Feb. 2014, Vol. 53, No. 5, pp. 951-959, when a distance between the mold and the substrate is changed even though the relative position of the mold and the substrate in a periodic direction of the one-dimensional diffraction grating is not changed, positional deviation of the detected moiré pattern occurs, thereby resulting in a larger measurement error.

SUMMARY

One disclosed aspect of the embodiments is directed to a technique capable of detecting the moiré pattern generated by a plurality of diffraction gratings with high accuracy.

According to an aspect of the embodiments, a detection device includes an illumination optical system and a detection optical system. The illumination optical system is configured to illuminate a first one-dimensional diffraction grating having a period, or a first period, in a first direction and a second one-dimensional diffraction grating having a period, or a second period, different from the first period of the first diffraction grating in the first direction. The detection optical system is configured to detect diffracted light diffracted by the first diffraction grating and the second diffraction grating. The illumination optical system includes an optical member configured to form, on a pupil plane, a first pole and a second pole that is located on side opposite to the first pole with respect to an optical axis. The illumination optical system causes light from the first pole and light from the second pole to obliquely enter the first diffraction grating and the second diffraction grating from the first direction to illuminate the first diffraction grating and the second diffraction grating, and the detection optical system detects diffracted light that has been diffracted by one of the first diffraction grating and the second diffraction grating and further diffracted by an other one of the first diffraction grating and the second diffraction grating.

Further features of the disclosure will become apparent from the following description of exemplary embodiments with reference to the attached drawings.

BRIEF DESCRIPTION OF THE DRAWINGS

FIGS. 5A to 5F are diagrams illustrating alignment marks for generating a moiré pattern, and moiré patterns.

DESCRIPTION OF THE EMBODIMENTS

Figure 2:
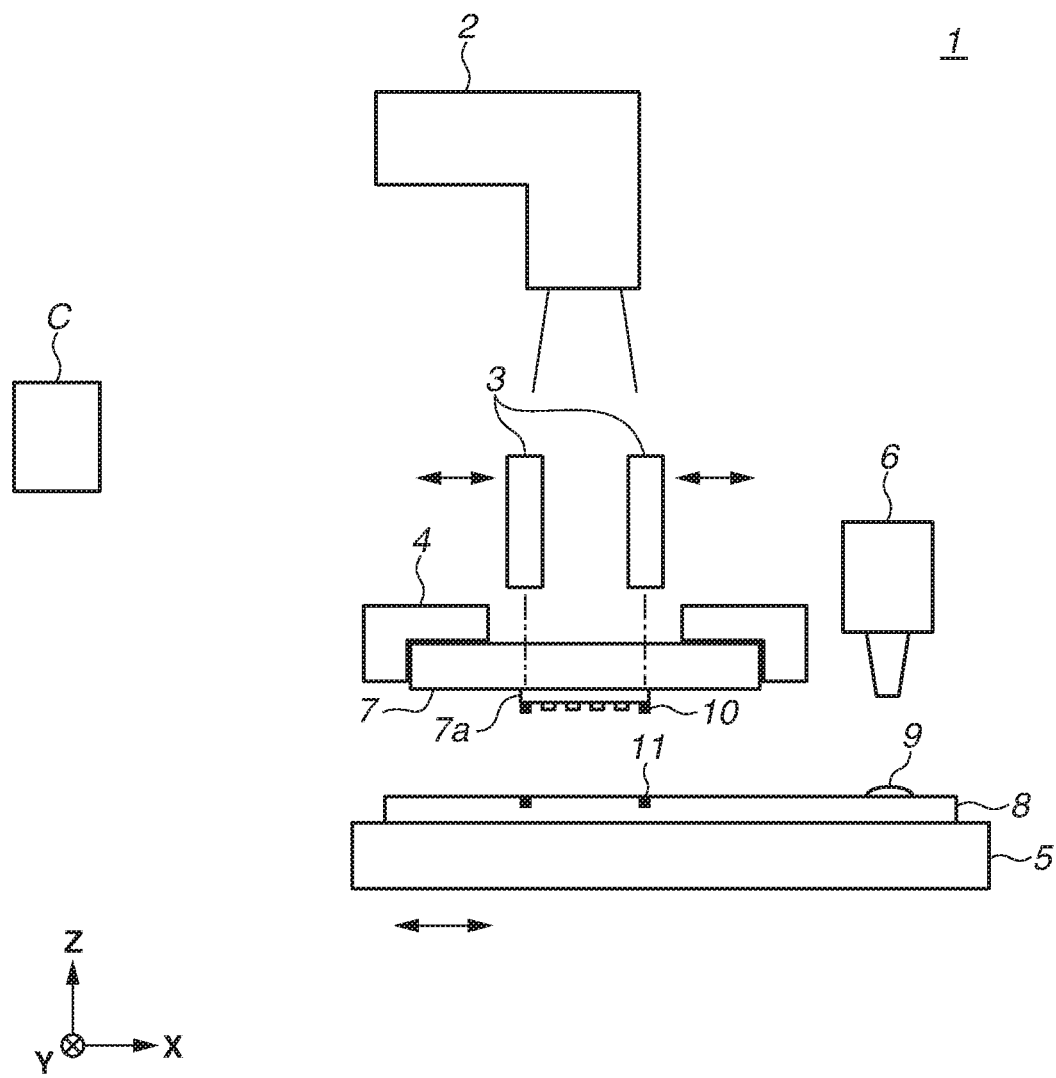
FIG. 2 is a diagram schematically illustrating a configuration of an imprint apparatus.

FIG. 2 is a diagram illustrating a configuration of an imprint apparatus according to a first exemplary embodiment. The imprint apparatus is used for manufacturing a device such as a semiconductor device. More specifically, the imprint apparatus shapes an uncured resin (imprint material or composition) on a substrate (wafer or glass) by using a mold to form a resin pattern on the substrate. The imprint apparatus according to the present exemplary embodiment employs a photo-curing method. Further, in the following diagrams, an X axis and a Y axis are orthogonal to each other in a plane parallel to the substrate and the mold, and a Z axis is perpendicular to the X axis and the Y axis. An imprint apparatus 1 includes an ultraviolet-ray radiation unit 2, a measurement optical system 3, a mold holding unit 4, a wafer stage 5, and a coating unit 6. The imprint apparatus 1 further includes a control unit C that controls the units of the imprint apparatus 1.

The ultraviolet-ray radiation unit 2 radiates ultraviolet rays to a mold 7 in order to cure a resin on a wafer 8 after mold pressing processing that brings the mold 7 into contact with the resin. The ultraviolet-ray radiation unit 2 includes a light source and a plurality of optical devices (not illustrated). The plurality of optical devices is used to uniformly irradiate, in a predetermined shape, a concave-convex pattern 7a described below (irradiated surface) with ultraviolet rays emitted from the light source. In particular, a radiation area (radiation range) of light emitted from the ultraviolet-ray radiation unit 2 is desirably equivalent to or slightly larger than a surface area of the concave-convex pattern 7a. This is to prevent the mold 7 or the wafer 8 from being expanded due to heat by the irradiation and to prevent occurrence of positional deviation and distortion of the pattern transferred to the resin, by minimizing the irradiated area. In addition, this is to prevent occurrence of abnormality in the operation of the coating unit 6 described below due to the fact that the ultraviolet rays reflected by the wafer 8 reaches the coating unit 6 to cure the resin remaining in an ejection portion of the coating unit 6. As the light source, for example, a high-pressure mercury lamp, various types of excimer lamps, an excimer laser, or a light-emitting diode (LED) can be used. The light source is appropriately selected depending on characteristics of the resin as a light receiving material; however, a type, a number, and a wavelength of the light source are not limited.

The mold 7 is a mold that has a three-dimensional predetermined pattern (e.g., concave-convex pattern 7a such as circuit pattern) on a surface facing the wafer 8. Examples of a material of the mold 7 include quartz that allows the ultraviolet rays to pass through.

The mold holding unit 4 attracts and holds the mold 7 by a vacuum suction force or an electrostatic force. Although not illustrated, the mold holding unit 4 includes a mold chuck and a mold driving mechanism that drives the mold chuck in the Z-axis direction in order to press the mold 7 against the ultraviolet curable resin coated on the wafer 8. The mold holding unit 4 may further include a mold magnification correction mechanism that deforms the mold in the X-axis direction and the Y-axis direction to correct distortion of the pattern to be transferred to the resin. Although the operation to press the mold and to release the mold in the imprint apparatus 1 may be achieved by moving the mold 7 in the Z-axis direction as described above, the operation may be achieved by, for example, moving the wafer stage 5 (wafer 8) in the Z-axis direction or moving both of the mold 7 and the wafer stage 5.

The wafer stage 5 is a substrate holding unit that holds the wafer 8 by, for example, vacuum suction so as to be movable in the XY plane. For example, the wafer 8 is a processing object made of monocrystalline silicon, and a surface to be processed is coated with an ultraviolet curable resin (hereinafter, simply referred to as "resin") to be shaped by the mold 7.

The imprint apparatus 1 further includes the measurement optical system (or a detection device) 3 that performs measurement for relative alignment of the mold 7 and the wafer 8. The measurement optical system 3 is an optical system that optically detects alignment marks 10 and 11 respectively provided on the mold 7 and the wafer 8 to measure the relative position thereof. The measurement optical system 3 is disposed in such a manner that an optical axis thereof becomes perpendicular to the mold 7 or the wafer 8. Further, the measurement optical system 3 is configured so as to be driven in the X-axis direction and the Y-axis direction based on the position of the mark provided on the mold 7 or the wafer 8. Moreover, the measurement optical system 3 is configured so as to be driven in the Z-axis direction in order to focus the optical system on the positions of the marks. The control unit C controls driving of the wafer stage 5 and the magnification correction mechanism based on information of the relative position of the mold and the wafer measured by the measurement optical system 3 (detection result of detection device). The measurement optical system 3 and the alignment marks 10 and 11 are described in detail below.

The coating unit 6 coats the wafer 8 with the resin (uncured resin) 9. The resin 9 is a photocurable resin that has a property to be cured by irradiation with ultraviolet rays, and is appropriately selected depending on a type or other characteristics of the semiconductor device. The coating unit 6 may not be provided inside the imprint apparatus 1 as illustrated in FIG. 2, and a coating apparatus may be separately prepared outside the imprint apparatus 1, and the wafer 8 previously coated with the resin by the coating apparatus may be introduced into the imprint apparatus 1. This configuration eliminates a coating step inside the imprint apparatus 1, which makes it possible to accelerate the processing by the imprint apparatus 1. Further, since the coating unit 6 becomes unnecessary, it is possible to suppress manufacturing cost of the whole of the imprint apparatus 1.

Next, imprint processing performed by the imprint apparatus 1 will be described. First, the wafer 8 is conveyed to the wafer stage 5 by a substrate conveyance unit (not illustrated), and the wafer 8 is placed on and fixed to the wafer stage 5. Subsequently, the wafer stage 5 is moved to a coating position of the coating unit 6, and the coating unit 6 then coats a predetermined shot area (imprint area) of the wafer 8 with the resin (uncured resin) 9 in the coating step. Next, the wafer stage 5 is moved such that the coated surface of the wafer 8 is located just below the mold 7. Thereafter, the mold driving mechanism is driven to press the mold 7 to the resin 9 on the wafer 8 (mold pressing step). At this time, the resin 9 flows along the concave-convex pattern 7a formed in the mold 7 by pressing of the mold 7. Further, in this state, the measurement optical system 3 detects the alignment marks 10 and 11 respectively provided on the mold 7 and the wafer 8. The control unit C drives the wafer stage 5 to align the pressing surface of the mold 7 and the coated surface of the wafer 8, performs magnification correction of the mold 7 by the magnification correction mechanism, based on the detection result. When the resin 9 sufficiently flows into the concave-convex pattern 7a, the mold 7 and the wafer 8 are sufficiently aligned, and the magnification correction of the mold 7 is sufficiently performed, the ultraviolet-ray radiation unit 2 radiates ultraviolet rays to a rear surface (top surface) of the mold 7 in a curing step. The resin 9 is cured by the ultraviolet rays passed through the mold 7. At this time, the measurement optical system 3 is retreated so as not to block an optical path of the ultraviolet rays. Subsequently, the mold driving mechanism is driven again to release the mold 7 from the wafer 8 (mold releasing step). As a result, the concave-convex pattern 7a of the mold 7 is transferred to the wafer 8.

Figure 3:
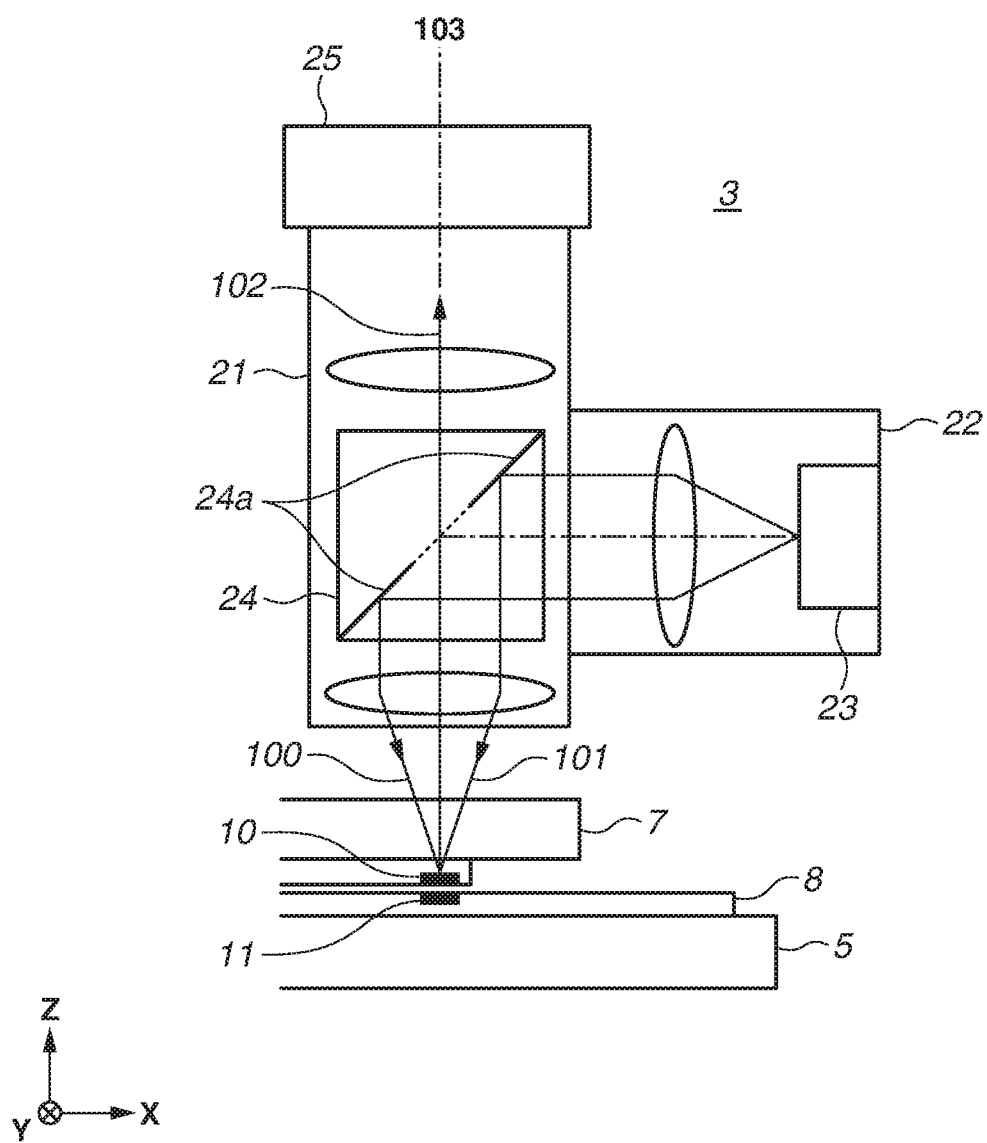
FIG. 3 is a diagram illustrating an example of a configuration of a detection device according to the first exemplary embodiment.

Next, the details of the measurement optical system 3 and the alignment marks 10 and 11 respectively provided on the mold 7 and the wafer 8 are described. FIG. 3 is a diagram illustrating an example of a configuration of the measurement optical system 3 according to the present exemplary embodiment. The measurement optical system 3 includes a detection optical system 21 and an illumination optical system 22. The illumination optical system 22 guides light from an alignment light source 23 to the same optical axis as the optical axis of the detection optical system 21 by using a prism 24 and other optical elements, and illuminates the alignment marks 10 and 11. For example, a halogen lamp, an LED, a semiconductor laser (LD), a high-pressure mercury lamp, or a metal halide lamp is used for the alignment light source 23. The alignment light source 23 radiates visible light not including ultraviolet rays that cure resist, or infrared rays. The detection optical system 21 and the illumination optical system 22 share a part of optical components thereof, and the prism 24 is disposed on or near a pupil plane of each of the detection optical system 21 and the illumination optical system 22. Each of the alignment marks 10 and 11 is formed of a diffraction grating. The detection optical system 21 forms, on an imaging device 25, an image of an interference pattern (moiré pattern) that is generated by interference of diffracted light from the alignment marks 10 and 11 illuminated by the illumination optical system 22. As the imaging device 25, a charge-coupled device (CCD) sensor or a complementary metal-oxide semiconductor (CMOS) sensor is used. Since the interference pattern (moiré pattern) is generated by the diffracted light diffracted by the alignment marks (diffraction gratings) on the mold 7 and the wafer 8, an obtained light amount of the moiré pattern is varied depending on diffraction efficiency of the diffraction gratings of the mold 7 and the wafer 8. In particular, since the diffraction efficiency is varied based on the wavelength, there are a wavelength at which the moiré pattern is efficiently detectable and a wavelength at which the moiré pattern is not efficiently detectable. The light of the wavelength at which the moiré pattern is difficult to be detected may become noise.

The prism 24 includes, on a bonded surface, a reflective film 24a (light guide portion and also referred to as a peripheral portion 24a) that reflects and guides light near the pupil plane of the illumination optical system 22 to the diffraction gratings. In the configuration illustrated in FIG. 3, light illuminating the diffraction gratings is formed by the reflective film 24a of the prism 24.

Further, the reflective film 24a also functions as an aperture stop that specifies a size NAo (detection numerical aperture (NA)) of the pupil of the detection optical system 21, and guides the diffracted light that has passed through a center portion close to the optical axis inside the reflective film 24a, to the imaging device 25. The prism 24 may be a half prism including a semi-transparent film on a bonding surface, or may be a plate-like optical device including a reflective film on a surface without being limited to the prism. Further, the peripheral portion 24a (i.e., a portion corresponding to the reflective film 24a) of the prism 24 in FIG. 3 may serve as a transmission portion (light guide portion) and the center portion may serve as a reflective portion, and the positions of the alignment light source 23 and the imaging device 25 may be reversed. In this configuration, the light having passed through the transmission portion on the peripheral portion 24a of the prism 24 is guided to the diffraction gratings, the diffracted light from the diffraction gratings is reflected by the reflective portion, and the reflected light is received by the imaging device 25. With these configurations, illumination light 100 and illumination light 101 from the alignment light source 23 illuminates the alignment marks 10 and 11 from an oblique direction on an XZ plane, and diffracted light 102 generated therefrom is taken into a detection area NAo for signal detection. The illumination light 100 and illumination light 101 are disposed on sides opposite, preferably symmetrically, to each other with respect to the optical axis 103 of the illumination optical system 22 on the XZ plane.

Figure 4:
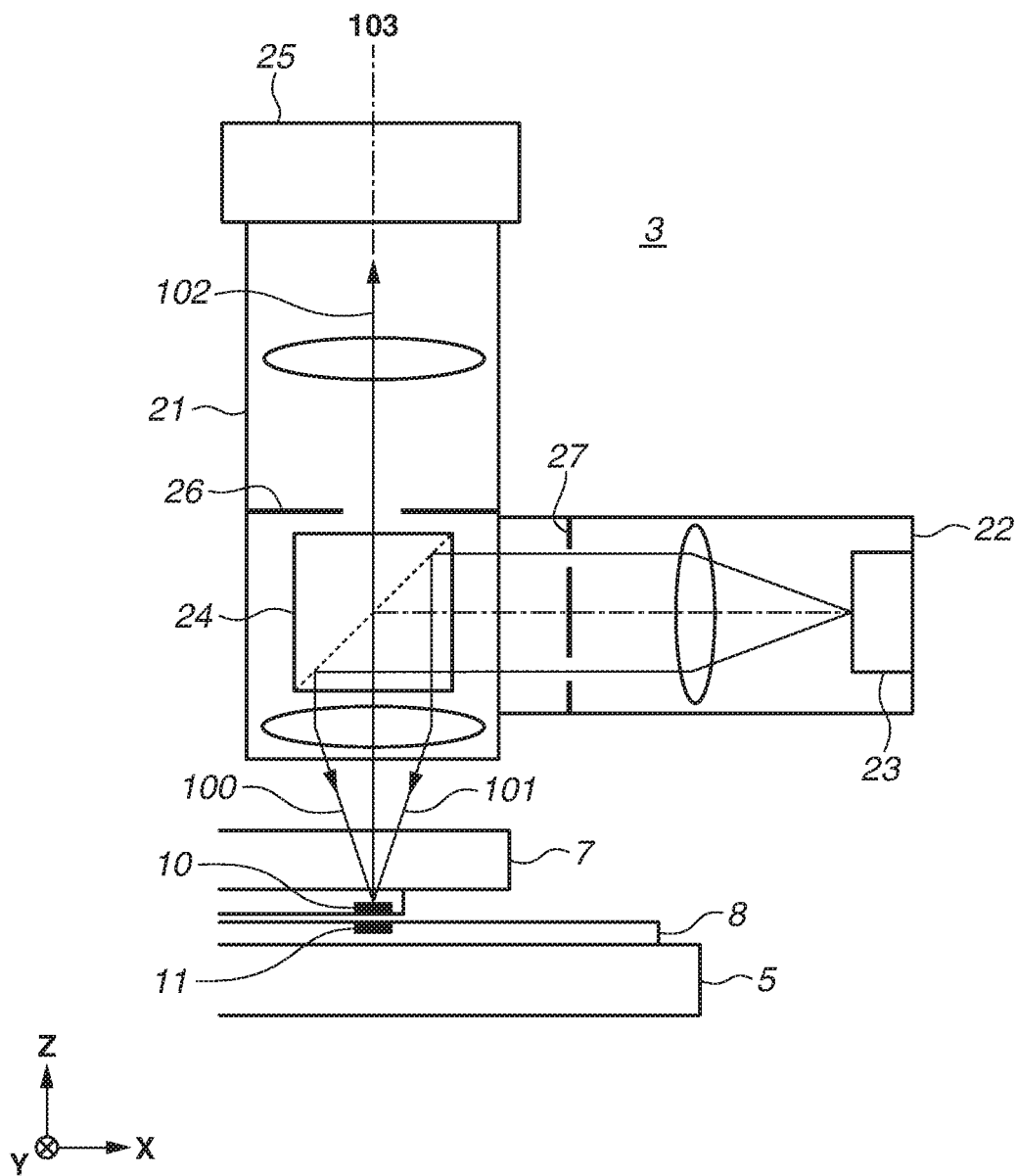
FIG. 4 is a diagram illustrating a modification example of the detection device.

The aperture stop according to the present exemplary embodiment may not necessarily be disposed in the prism 24. For example, as illustrated in FIG. 4, the detection optical system 21 and the illumination optical system 22 may respectively include aperture stops 26 and 27 on the respective pupil planes. In this configuration, for example, a half prism including a semi-transparent film on the bonding surface is used for the prism 24. Further, the aperture stops may not be disposed on or near the respective pupil planes of the detection optical system 21 and the illumination optical system 22 as long as the aperture stops can form light intensity distribution of the respective pupil planes.

A generation principle of the moiré pattern by the diffracted light from the alignment marks 10 and 11, and a detection method of the relative positions of the alignment mark 10 (mold 7) and the alignment mark 11 (wafer 8) with use of the moiré pattern, are described with reference to FIGS. 5A to 5F. As illustrated in FIG. 5A and FIG. 5B, each of a diffraction grating (first diffraction grating) 41 provided as the alignment mark 10 on the mold 7 and a diffraction grating (second diffraction grating) 42 provided as the alignment mark 11 on the wafer 8 is a one-dimensional diffraction grating having a period in the X direction. The one-dimensional diffraction grating includes a one-dimensional pattern in which a large number of straight lines (irregularity or reflective film) are periodically arranged in parallel in one direction (first direction). The first diffraction grating 41 and the second diffraction grating 42 are slightly different in the period of the pattern (grating) in a periodic direction (pattern repeating direction). When the two diffraction gratings different in period of grating are overplayed on each other, a so-called moiré pattern that is a pattern having a period reflecting the period difference between the diffraction gratings is generated by interference of the diffracted light from the two diffraction gratings. At this time, the phase of the moiré pattern is changed based on the relative positions of the diffraction gratings 41 and 42. Therefore, the relative positions of the alignment mark 10 and the alignment mark 11, i.e., the relative positions of the mold 7 and the wafer 8 can be determined by detecting the moiré pattern. When the relative positions of the diffraction grating 41 and the diffraction grating 42 in the periodic direction are changed, the moiré pattern is moved in the X direction.

More specifically, when the diffraction grating 41 and the diffraction grating 42 that are slightly different in period are overlaid on each other, the diffracted light from the diffraction grating 41 and the diffracted light from the diffraction grating 42 is overlapped with each other and the moiré pattern having the period reflecting the period difference of the diffraction grating 41 and the diffraction grating 42 is accordingly generated as illustrated in FIG. 5C. As described above, a dark position and a bright position (phase of pattern) of the moiré pattern are changed based on the relative positions of the diffraction grating 41 and the diffraction grating 42. For example, when one of the diffraction gratings 41 and 42 is shifted in the X direction, the moiré pattern illustrated in FIG. 5C is changed to a moiré pattern illustrated in FIG. 5D. FIG. 5C and FIG. 5D each illustrate an image of the moiré pattern acquired by the imaging device 25, and FIG. 5E and FIG. 5F illustrate signals of the moiré patterns corresponding to the respective images. In FIG. 5E and FIG. 5F, a horizontal axis indicates X coordinate, and a vertical axis indicates signal intensity. The moiré pattern is generated as the pattern having a period larger than the period of the diffraction gratings by enlarging an actual amount of the positional deviation between the diffraction grating 41 and the diffraction grating 42. Therefore, even if resolving power of the detection optical system 21 is low, it is possible to measure the relative positions of the diffraction grating 41 and the diffraction grating 42 with high accuracy.

Figure 6:
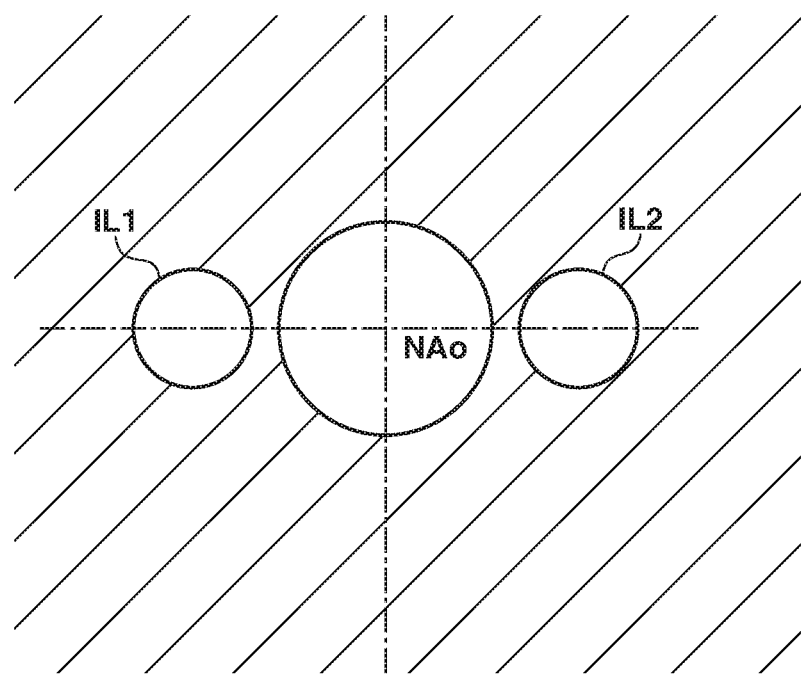
FIG. 6 is a diagram illustrating illumination light and a detection aperture on a pupil plane of an optical system.

A case where the diffraction gratings 41 and 42 are illuminated from two oblique directions and only diffracted light is detected in dark field in order to detect such a moiré pattern is considered. FIG. 6 is a diagram illustrating a relationship between pupil intensity distribution (first and second poles IL1 and IL2) of the illumination light formed by the illumination optical system 22 of the measurement optical system 3 and the numerical aperture NAo of the detection optical system 21. The first pole IL1 forms illumination light 100 (see FIGS. 3 and 4) and a second pole IL2 forms illumination light 101 (see FIGS. 3 and 4). In this case, an area that has light intensity higher than light intensity of its surroundings in the light intensity distribution on the pupil plane of the illumination optical system 22 is called a pole. The illumination light 100 from the first pole IL1 is radiated to the diffraction gratings 41 and 42 each having periodicity in the X direction, which generates the diffracted light in a predetermined direction in the XZ plane. At this time, a component of the reflected light (so-called 0th order diffracted light) that is not diffracted by the diffraction gratings 41 and 42 does not return to the detection area NAo, which achieves dark field detection. Further, the light diffracted in the XZ plane by the diffraction gratings 41 and 42 slightly different in period enters the detection area NAo on the pupil of the detection optical system 21 while including information on the relative positions of the two diffraction gratings in the X direction, and is detected by the imaging device 25. The illumination light from the second pole IL2 similarly achieves the dark field detection. The light diffracted in the XZ plane by the diffraction gratings 41 and 42 slightly different in period enters the detection area NAo on the pupil of the detection optical system 21, and is detected by the imaging device 25. The illumination light 100 and illumination light 101 are arranged on sides opposite, preferably symmetrically, to each other with respect to the optical axis 103 (see FIGS. 3 and 4) on the XZ plane. The moiré patterns formed by the two rays of illumination light are synthesized and the synthetic moiré pattern is measured. This makes it possible to determine the relative positions of the diffraction gratings 41 and 42 with high accuracy.

The positions of the alignment marks 10 and 11 in the Z direction and the distance between the alignment marks 10 and 11 are ideally kept unchanged; however, the positions and the distance are actually slightly changed. At this time, when the moiré pattern is measured with illumination from one of the first pole IL1 and the second IL2, the measurement result is changed depending on the distance between the alignment marks 10 and 11 and the positions of the alignment marks 10 and 11 in the Z direction. If the distance between the alignment marks 10 and 11 and the positions of the alignment marks 10 and 11 in the Z direction are changed, the position at which the illumination light is reflected or diffracted by each of the alignment marks is shifted in the periodic direction, which shifts the moiré pattern in the periodic direction. However, the moiré pattern by the illumination light from the first pole IL1 and the moiré pattern by the illumination light from the second pole IL2 are shifted in the opposite directions with respect to change of the distance between the alignment marks 10 and 11 and the positions of the alignment marks 10 and 11 in the Z direction. Accordingly, in the present exemplary embodiment, the first pole IL1 and the second pole IL2 are arranged on sides opposite, preferably symmetrically, to each other with respect to the optical axis. This reduces the shift of the moiré patterns and reduces measurement error of the relative positions of the alignment marks with respect to the change of the distance between the alignment marks in the Z direction. In a case where the first pole IL1 and the second pole IL2 are arranged symmetrically with respect to the optical axis, the moiré patterns are shifted by the same shift amount in the opposite directions. Therefore, the shift amounts are cancelled and the measurement error does not occur. Although the center positions of the first pole IL1 and the second pole IL2 are located on the X axis in FIG. 6, the center positions may be shifted in the Y direction from on the X axis as long as the component of the illumination light illuminating from the X-axis direction is contained.

Figure 1A:
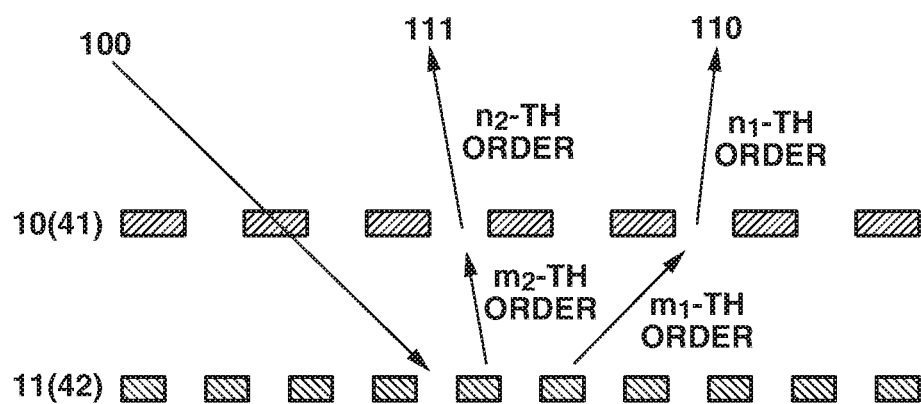
FIGS. 1A and 1B are diagrams each illustrating diffracted light according to a first exemplary embodiment.
Figure 1B:
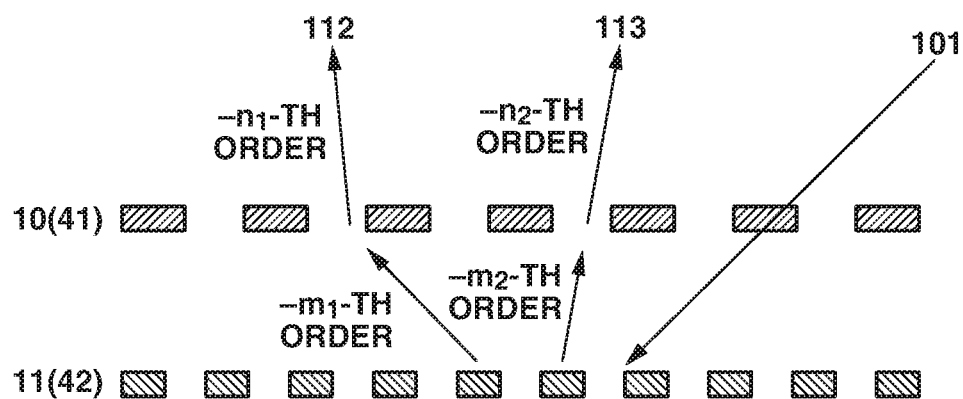

FIG. 1A and FIG. 1B respectively illustrate examples of paths of the light from the first pole IL1 and the light from the second pole IL2 that are diffracted by the diffraction gratings. When a diffraction order of the diffraction by the diffraction grating 41 is denoted by a variable m, and a diffraction order of the diffraction by the alignment mark (diffraction grating) 10 is denoted by a variable n, the synthetic diffracted light generated through successive diffraction by the alignment marks (diffraction gratings) 10 and 11 is expressed by a combination of the diffraction orders (m, n). The variables m and n are integers.

The illumination light 100 from the first pole IL1 passes through the alignment mark 10 (diffraction grating 41) on the mold 7, and illuminates the alignment mark 11 (diffraction grating 42) on the wafer 8. The diffractive grating 42 is of a reflective type, and the diffracted light is generated by the diffraction grating 42 in directions specified by respective diffraction orders m1 and m2. Each diffracted light illuminates a bottom surface of the diffraction grating 41, and the diffracted light is accordingly generated by the diffraction grating 41 in directions specified by respective diffraction orders n1 and n2. The light diffracted by the two alignment marks travels as synthetic diffracted light 110 specified by a combination of the orders (m, n)=(m1, n1) and synthetic diffracted light 111 specified by a combination of the orders (m, n)=(m2, n2), toward the detection optical system 21. The synthetic diffracted light 110 and synthetic diffracted light 111 are guided into the pupil of the detection optical system 21, i.e., into the numerical aperture NAo and interfere with each other to form the moiré pattern. To appropriately observe the moiré pattern by the imaging device 25, it is necessary to appropriately set a pitch of each of the diffraction gratings 40 and 41 and an illumination angle of the illumination light 100, and to appropriately select the diffraction orders m1-th order, m2-th order, n1-th order, and n2-th order (integers). Specific examples of setting and selection are described below.

The illumination light 101 from the second pole IL2 illuminates the alignment marks 10 and 11 from the side (opposite direction) opposite to the illumination light 100 with respect to the optical axis 103 of the illumination optical system 22. The moiré pattern is formed by interference between synthetic diffracted light 112 and synthetic diffracted light 113 that are generated by diffraction by the two alignment marks 10 and 11. In a case where the illumination light 100 and the illumination light 101 are arranged symmetrically with respect to the optical axis, the synthetic diffracted light 112 is specified by a combination of the orders (m, n)=(−m1, −n1), and the synthetic diffracted light 113 is specified by a combination of the orders (m, n)=(−m2, −n2). At this time, for the illumination light 100 and the illumination light 101 in common, a sign of the diffraction order on left side (one side) is positive, and a sign on right side (other side) is negative, with respect to n-th order light on a paper surface when viewed toward the surface of the figure. The signs are similarly illustrated in FIGS. 1A and 1B and the following figures.

Since the illumination light 100 and the illumination light 101 are incoherent with each other (low in coherency), the two moiré patterns are added in intensity to each other on the imaging device 25, and are detected as one moiré pattern.

When the pitch of the alignment mark 10 (diffraction grating 41) on the mold 7 is denoted by P1, and the pitch of the alignment mark 11 (diffraction grating 42) on the wafer 8 is denoted by P2, the period of the moiré pattern is expressed by P1×P2/|P1−P2|. In other words, the measured moiré pattern is enlarged and shifted by P2/|P1−P2| with respect to the shift amount of the alignment mark 10. This enables measurement with high accuracy, as compared with measurement with the single alignment mark 10.

A case where the diffraction grating on the mold and the diffraction grating 42 on the wafer have physical positional difference (hereinafter, referred to as gap) in the Z direction (focusing direction) is considered. For example, in a case where amplitudes of the two synthetic diffracted light 110 and synthetic diffracted light 111 forming the moiré patterns are different by illumination only with the first pole IL1, the positions of the measured moiré patterns are changed depending on an amount of the gap between the diffraction grating 41 on the mold and the diffraction grating 42 on the wafer. For example, in a case where an incident angle of the light is eight degrees and the amount of the gap between the diffraction grating 41 on the mold and the diffraction grating 42 on the wafer is 100 nm, positional error of 14 nm is generated. In particular, in a case where an apparatus in which the amount of the gap between the diffraction grating 41 on the mold and the diffraction grating 42 on the wafer is large is manufactured or in a case where a material with a large refractive index is used between the mold and the wafer, the measurement error caused by the amount of the gap becomes intolerable.

Accordingly, to reduce the measurement error caused by the gap between the diffraction grating 41 on the mold and the diffraction grating 42 on the wafer, the diffraction gratings 41 and 42 are illuminated with the illumination light from the two directions of the first pole and the second pole in the present exemplary embodiment. The moiré patterns formed by illumination from the first pole and the second pole are formed in a state of being shifted in the opposite directions. Since the moiré patterns formed by the poles are synthesized and detected, the shift is not detected even though contrast is reduced. This makes it possible to reduce the error caused by the gap between the diffraction grating 41 on the mold and the diffraction grating 42 on the wafer. In other words, when comparing illumination with light only from the first pole and illumination with light from the first pole and the second pole, the illumination with light from the two poles is more advantageous in terms of the shift amount of the formed moiré pattern.

Figure 7:
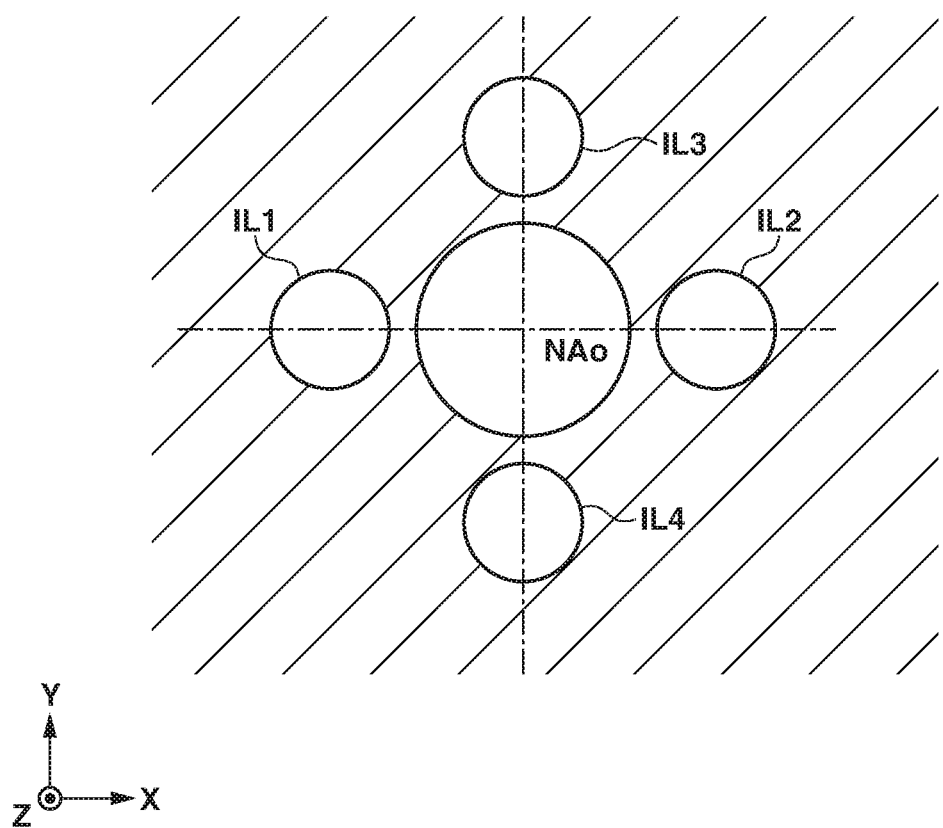
FIG. 7 is a diagram illustrating a modification example of the illumination light and the detection aperture on the pupil plane of the optical system.

While the diffraction grating having periodicity in the X direction has been described above, a diffraction grating having periodicity in the Y direction may be added and used. As the illumination light, illumination light as illustrated in FIG. 7 is used. FIG. 7 is a diagram illustrating a relationship between light intensity distribution (poles IL1 to IL4) on the pupil plane of the illumination optical system 22 and the detection area NAo of the detection optical system 21. The poles IL3 and IL4 arranged in the Y direction are added to the illumination light in FIG. 7, in addition to the pole IL1 and the pole IL2. The poles IL1 and IL2 illuminate the diffraction gratings 41 and 42 from the oblique direction along the X direction, and the poles IL3 and IL4 illuminate the diffraction gratings 41 and 42 from the oblique direction along the Y direction. In other words, the diffraction gratings 41 and 42 can be illuminated with illumination light obliquely entering from both of the X direction and the Y direction. As a result, it is possible to measure the relative positions of the alignment mark 10 in the Y direction on the mold and the alignment mark 11 in the Y direction on the wafer by illumination (poles IL3 and IL4) from the Y direction. At this time, the one-dimensional diffraction grating having the period in the X direction and the one-dimensional diffraction grating having the period in the Y direction are disposed within a range detectable by the imaging device 25. Further, the moiré pattern formed by the diffraction gratings 41 and 42 illuminated with the illumination light in FIG. 7 are imaged, which enables for measurement of the relative positions in the X direction and the Y direction by imaging performed once. This makes it possible to reduce a time required for measurement in both of the X and Y directions. At this time, the light from a non-measurement direction (poles IL3 and IL4 in a case of diffraction grating in X direction, and poles IL1 and IL2 in a case of diffraction grating in Y direction) is not detected in the numerical aperture NAo of the detection optical system 21. Therefore, the light is not detected as stray light, and does not affect the measurement accuracy.

In the light intensity distribution on the pupil plane of the illumination optical system 22, the area having the light intensity higher than the light intensity of its surroundings is regarded as the pole; however, light may exist between the poles. Further, the light intensity distribution may have an annular shape (annular illumination). In this case, two peaks (poles) of the light intensity are formed in each of the X direction and the Y direction. Accordingly, the illumination optical system can radiate light having a plurality of poles in the non-measurement direction even with use of the annular illumination. In addition, as the unit forming the light intensity distribution on the pupil plane of the illumination optical system 22, an optical member that deforms the light flux, such as a diffractive optical device, a hologram, a fiber, and a prism may be used other than the above-described aperture stop.

The control unit of the imprint apparatus 1 acquires data of the moiré pattern detected in the above-described manner, and determines the relative positions of the alignment mark 10 on the mold and the alignment mark 11 on the wafer based on the acquired data of the moiré pattern. Further, the control unit controls the relative positions of the mold and the wafer in the X and Y directions, the shape of the mold, and the shot shape of wafer, based on the determined relative positions. The relative positions of the mold and the wafer are controlled by driving the wafer stage and the mold stage. To deform the mold, a mechanism applying pressure to a side surface of the mold can be used. The shot shape of the wafer can be deformed by radiating light to heat the wafer.

The processing to measure the relative positions is repeated after the relative positions of the mold and the wafer, the mold shape, and the shot shape of the wafer are controlled. This makes it possible to adjust the positions and the shapes of the mold and the wafer with high accuracy.

As described above, according to the present exemplary embodiment, it is possible to reduce the lateral shift of the moiré pattern and to improve measurement accuracy by illuminating the one-dimensional diffraction gratings with the illumination light from the two directions opposite to each other with respect to the optical axis and detecting the moiré pattern.

A specific example of the diffraction gratings 41 and 42 is described. The pitch P1 of the diffraction grating 41 on the mold 7 is set to 5.2 μm, and the pitch P2 of the diffraction grating 42 on the wafer 8 is set to 4.2 μm. In the case of the illumination light 100, the period of the moiré pattern formed by interference of the two rays of synthetic diffracted light specified by (m, n)=(0, 1) and (m, n)=(1, 0) becomes P1×P2/(P1−P2)=21.84 μm. Likewise, in the case of the illumination light 101, the period of the moiré pattern formed by interference of the two rays of synthetic diffracted light specified by (m, n)=(0, −1) and (m, n)=(−1, 0) also becomes P1×P2/(P1−P2)=21.84 μm. At this time, if the diffraction grating 42 on the wafer is shifted by 1 μm, the moiré pattern is shifted by 5.2 μm. Therefore, the amount of the positional deviation of the diffraction grating 42 on the wafer can be measured with accuracy of 5.2 times.

The numerical aperture NA of the detection optical system 21 is set to 0.07, the illumination light incident angle of the pupil intensity distribution (poles IL1 to IL4) of the illumination optical system 22 is set to 8.6 degrees (corresponding to NA of 0.15), and a wavelength λ of the illumination light is set to 0.7 μm. Under such a condition, the 0th order diffracted light specified by (m, n)=(0, 0) is not detected because the light is radiated to the outside of the detection aperture of the detection optical system 21. The light that has been reflected by the wafer in 0th order and has been diffracted on the mold side in ±1st order, i.e., the synthetic diffracted light specified by (m, n)=(0, ±1) falls within the range of the numerical aperture NA=0.07, and is directed to the detection optical system 21. Further, the light that has been diffracted by the diffraction grating 42 on the wafer in ±1st order and has passed through the diffraction grating 41 on the mold, namely, the synthetic diffracted light specified by (m, n)=(±1, 0) also falls within the numerical aperture NA=0.07 and is directed to the detection optical system 21. In other words, when the above-described parameters are used, the synthetic diffracted light 110, the synthetic diffracted light 111, the synthetic diffracted light 112, and the synthetic diffracted light 113 illustrated in FIGS. 1A and 1B are all guided to the detection optical system 21 and contribute to formation of the moiré pattern.

In this example, the wavelength λ of the illumination light is set to 0.7 μm; however, the wavelength may be varied within a range detectable by the detection area NAo of the detection optical system 21, or a broad wavelength may be used. Further, in the above-described exemplary embodiment, the diffraction order of the diffracted light is limited to the range of −1≤m and n≤1. The moiré pattern, however, can be generated even when the orders m and n are ±2nd order and ±3rd order or higher orders as long as the synthetic diffracted light specified by the combination of the diffraction orders (m, n) is taken into the detection area NAo of the detection optical system 21. However, since the amplitude of the diffracted light is generally reduced as the diffraction order becomes high, the signal of the moiré pattern cannot be detected by the imaging device 25.

Figure 8:
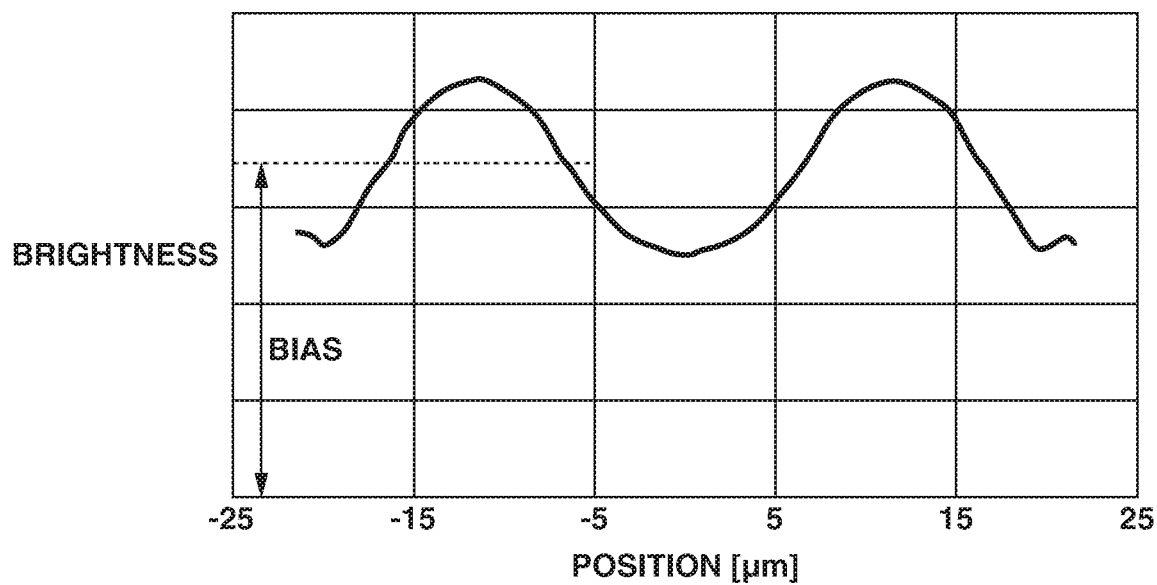
FIG. 8 is a diagram illustrating a waveform of the moiré pattern obtained through electromagnetic field analysis.

FIG. 8 illustrates the waveform of the moiré pattern obtained through electromagnetic field analysis. A horizontal axis indicates a position of the pattern, and a vertical axis indicates brightness of the light obtained on the imaging device 25. In this case, calculation is performed with use of the diffraction grating having a length equal to two periods of the moiré pattern. It is found from FIG. 8 that the moiré pattern in a sine wave shape is generated. In addition, a bias of a fixed value is generated with respect to the moiré pattern. This is because the light intensity (amplitude of detected signal) of the synthetic diffracted light specified by (m, n)=(0, 1) and the light intensity of the synthetic diffracted light specified by (m, n)=(1, 0) are different from each other. Since diffraction efficiency (depending on order m) from the diffraction grating 41 on the mold and diffraction efficiency (depending on order n) from the diffraction grating 42 on the wafer are different from each other, synthesized diffraction efficiency provided from synthesis of the both efficiencies is unbalanced, which causes the bias. The diffraction efficiency is caused by difference of the shape and the material of the diffraction pattern, and is also varied depending on the wavelength. This is because the reflectance of the material depends on the wavelength. Although no bias is preferable, it is possible to perform measurement with high accuracy as long as sufficient contrast is obtained.

To reduce the bias component, the wavelength of the light from the alignment light source 23 is selected so that the light intensities (amplitudes of detected signals) of the synthetic diffracted light forming the moiré pattern are equivalent to each other. As a method of selecting the wavelength in a case where a laser is used as the alignment light source 23, a plurality of lasers with wavelengths different from one another are synthesized by a beam splitter and a laser with required wavelength may be turned on, or output intensity of each of the lasers may be adjusted. Further, in a case where the alignment light source 23 is a broad light source such as a halogen lamp, a metal halide lamp, and an LED, the light with the specific wavelength is only allowed to pass through or is reflected by a wavelength cut filter to illuminate the diffraction gratings.

Figure 11A:
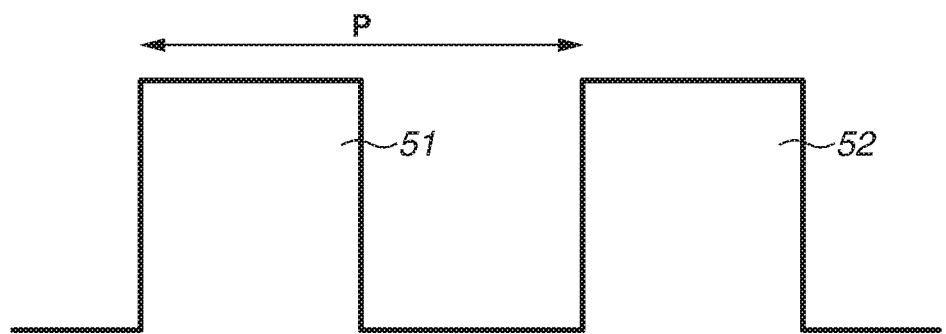
FIGS. 11A and 11B are enlarged cross-sectional views each illustrating a segmented diffraction grating.
Figure 11B:
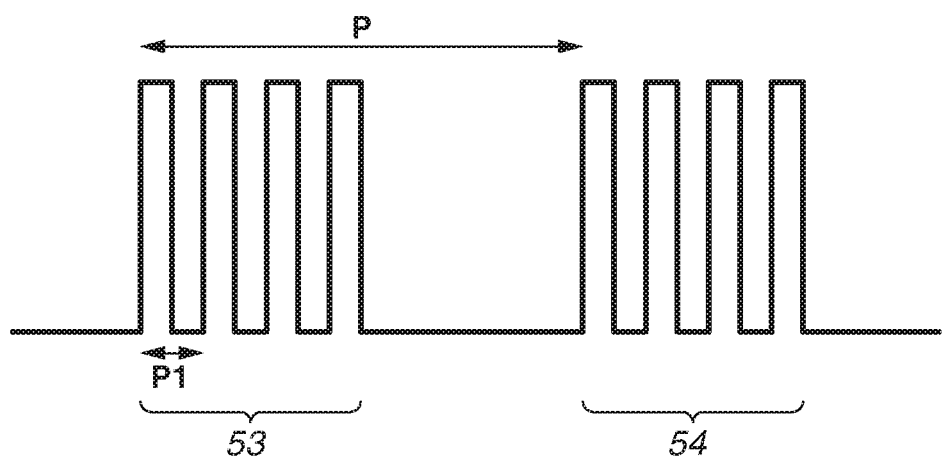

A method of making the amplitudes of the synthetic diffracted light forming the moiré pattern equal to each other includes segmentation of the patterns of the diffraction gratings. The segmentation indicates formation of a plurality of concave-convex patterns (hereinafter, referred to as segmented parts) in the period of about 10 nm to about 500 nm in a part of the diffraction grating pattern that has a width of several micrometers corresponding to one normal convex part. As illustrated in FIG. 11A, a periodic concave-convex pattern is generally provided in the diffraction grating, and a distance between convex parts 51 and 52 adjacent to each other is expressed as the period (pitch) P of the diffraction grating. FIG. 11B is an enlarged cross-sectional view of the segmented diffraction grating. As illustrated in FIG. 11B, minute concave-convex pattern is further provided in parts corresponding to the convex parts 51 and 52, and the parts are referred to as segmented parts 53 and 54. The distance between the segmented parts 53 and 54 corresponds to the period P of the diffraction grating, and the minute concave-convex pattern with a period (pitch) P1 smaller than the period P is provided in each of the segmented parts. Segmentation of the normal diffraction grating pattern causes high-order diffracted light to be generated, which reduces diffraction efficiency. Therefore, the diffraction grating pattern with high diffraction efficiency is segmented to reduce the diffraction efficiency of the diffracted light in a predetermined order, which makes it possible to adjust the light intensity of each ray of the synthetic diffracted light.

Further, the light intensity of each ray of the synthetic diffracted light can be adjusted by changing duty of the concave-convex pattern (ratio of width of convex part to width of concave part) of the diffraction grating.

Figure 9A:
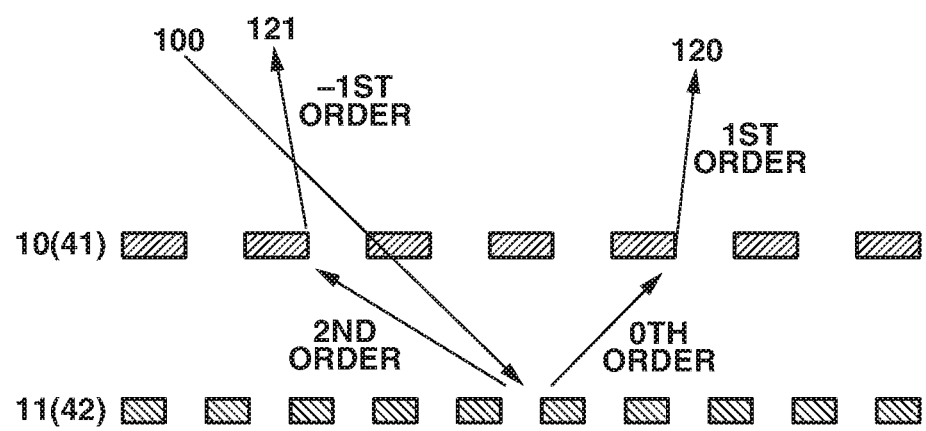
FIGS. 9A and 9B are diagrams each illustrating diffracted light according to a second exemplary embodiment.
Figure 9B:
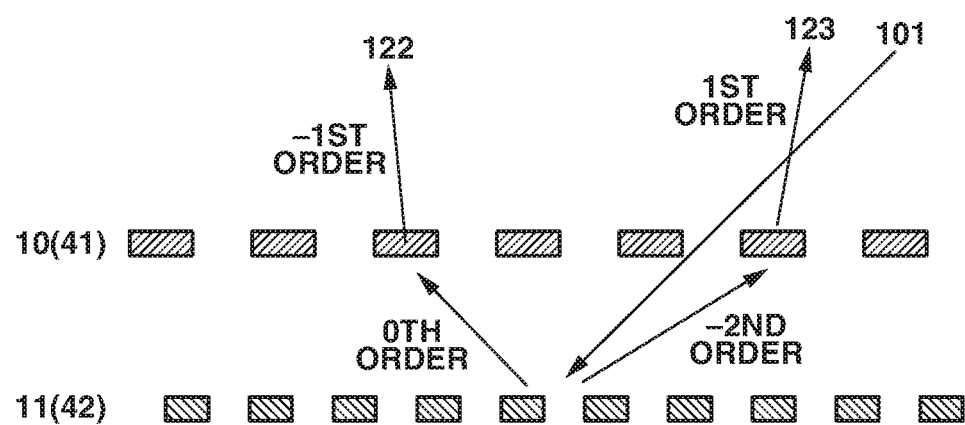

Next, a second exemplary embodiment is described with reference to FIGS. 9A and 9B. A device according to the present exemplary embodiment can be used in an apparatus including the same configuration as the first exemplary embodiment (FIGS. 2 to 4). FIGS. 9A and 9B each illustrate behavior of the illumination light and the synthetic diffracted light according to the second exemplary embodiment. The illumination light 100 and illumination light 101 pass through the alignment mark 10 (diffraction grating 41) on the mold 7, and is reflected and diffracted in the diffraction order m by the alignment mark 11 (diffraction grating 42) on the wafer 8. The diffracted light reflected in the above-described manner is diffracted in n-th order by the diffraction grating 41 on the mold 7 and enters the numerical aperture NAo of the detection optical system 21. The definition of the diffraction orders m and n and the signs are similar to the definition used in the above-described exemplary embodiment and example. In FIGS. 9A and 9B, only components of light that enters the detection optical system 21 to contribute to formation of the moiré pattern is illustrated among the rays of synthetic diffracted light generated by the illumination light 100 from the first pole IL1 and the illumination light 101 from the second pole IL2. Synthetic diffracted light 120 is specified by (m, n)=(0, 1), synthetic diffracted light 121 is specified by (m, n)=(2, −1), and the synthetic diffracted light 120 and the synthetic diffracted light 121 forms the first moiré pattern through interference. Synthetic diffracted light 122 is specified by (m, n)=(0, −1), synthetic diffracted light 123 is specified by (m, n)=(−2, 1), and the synthetic diffracted light 122 and the synthetic diffracted light 123 forms the second moiré pattern through interference. The first and second moiré patterns each include the same period, the moiré pattern signal is obtained through addition of the first and second moiré patterns, and the relative positions of the alignment mark 10 on the mold 7 and the alignment mark 11 on the wafer 8 can be accordingly measured.

As the pattern of the diffraction grating 42 on the wafer 8, a pattern that suppresses the diffraction efficiency of m=±1st order and enhances the diffraction efficiency of m=±2nd order is desirably used because the diffracted light of m=±2nd order is used together with the diffracted light of m=0th order. This is simply achievable by a pattern having a pitch that causes the ±1st order diffracted light by the diffraction grating 42 on the wafer 8 to be diffracted at a diffraction angle corresponding to m=±2nd order. In this way, it is possible to suppress the bias component as illustrated in FIG. 8.

As the illumination condition, the pupil intensity distribution of the illumination optical system 22 of the measurement optical system 3 illustrated in FIG. 6 and FIG. 7 is usable as with the first exemplary embodiment. The second exemplary embodiment is different from the first exemplary embodiment in that the diffracted light of m=0th order and m=±2nd order is used on the wafer side in the second exemplary embodiment in place of the diffracted light of m=0th order and m=±1st order on the wafer side in the first exemplary embodiment. Accordingly, when the pitch of the alignment mark 10 (diffraction grating 41) on the mold 7 is denoted by P1 and the pitch of the alignment mark 11 (diffraction grating 42) on the wafer 8 is denoted by P2, the period of the moiré pattern is expressed by P1×P2/(2×|P1−P2|). Therefore, the moiré pattern is enlarged and shifted by P2/(2×|P1−P2|) with respect to the shift amount of the alignment mark 10. Compared with the first exemplary embodiment, the enlargement magnification becomes ½ but the moiré pattern with short period is formed.

When the shape of the diffraction grating pattern on the wafer includes an error (e.g., pattern collapse, chipping of pattern edge), distortion occurs on the formed moiré pattern. Accordingly, if the number of periods of the moiré pattern is small, the moiré pattern is largely influenced by the error of the shape of the diffraction grating pattern. When the moiré pattern with a short period can be formed, the moiré pattern with the large number of periods can be formed in the same pattern area. This is advantageous to reduce the error of the shape of the diffraction grating pattern on the wafer.

A method of enhancing the intensity of the diffracted light of m=±2nd order includes segmentation of the diffraction grating pattern. To enhance intensity of m-th order diffracted light, the period of the diffraction grating pattern is set to 1/m (m is integer). In other words, P2'=P2/m pattern is formed in the diffraction grating pattern. For example, forming P2'=P2/2 pattern in the diffraction grating pattern makes it possible to enhance the intensity (amplitude) of the diffracted light of m=±2nd order.

A specific configuration according to the second exemplary embodiment is described. The pitch P1 of the diffraction grating 41 on the mold 7 is set to 5.2 μm, and the pitch P2 of the diffraction grating 42 on the wafer 8 is set to 4.6 μm. The period of the moiré pattern formed by the diffracted light specified by (m, n)=(2, −1) and the diffracted light specified by (m, n)=(0, 1) becomes P1×P2/(2×|P1−P2|)= 19.93 μm. In this case, if the diffraction grating on the wafer is shifted by 1 μm, the moiré pattern is shifted by 8.7 μm. Therefore, the amount of the positional deviation of the diffraction grating on the wafer can be measured with accuracy of 8.7 times.

Although the pitch P2 of the diffraction grating 42 is set to 4.6 μm, the diffraction grating pattern having the pitch of P2'=P2/2=2.3 μm is actually used in order to enhance the diffraction efficiency of the m=±2nd order diffracted light in the present exemplary embodiment.

The numerical aperture NA of the detection optical system 21 is set to 0.07, the illumination light incident angle of the pupil intensity distribution (poles IL1 to IL4) of the illumination optical system 22 is set to 8.6 degrees, and the wavelength λ of the illumination light is set to 0.7 μm. Under this condition, the 0th order diffracted light specified by (m, n)=(0, 0) is radiated to the outside of the detection area of the detection optical system 21 and is not detected. On the other hand, the synthetic diffracted light 120, the synthetic diffracted light 121, the synthetic diffracted light 122, and the synthetic diffracted light 123 illustrated in FIGS. 9A and 9B are all guided to the detection optical system 21 and contribute to formation of the moiré pattern.

Figure 10A:
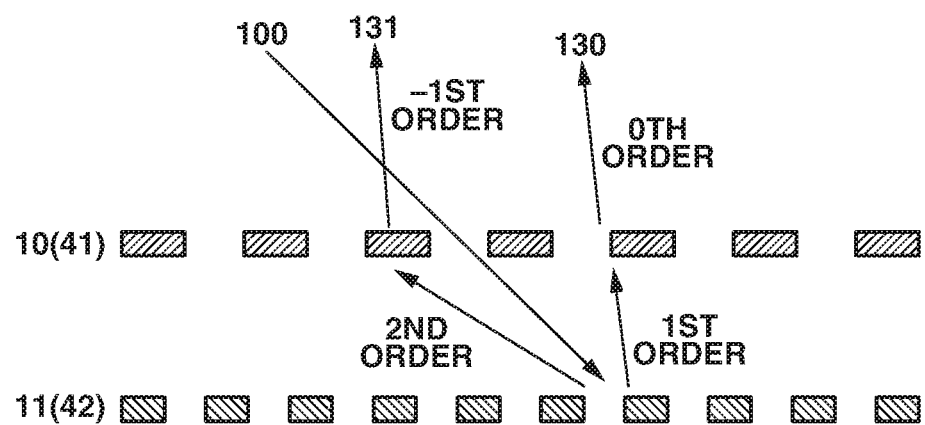
FIGS. 10A and 10B are diagrams each illustrating diffracted light according to a third exemplary embodiment.
Figure 10B:
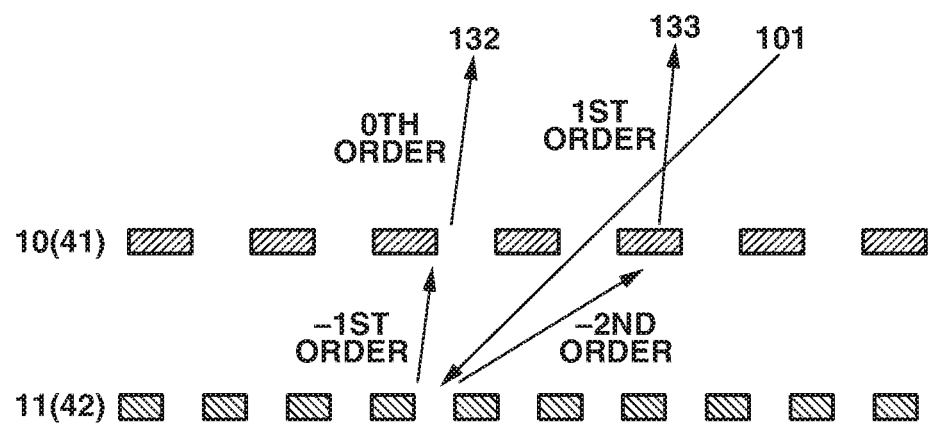

Next, a third exemplary embodiment is described with reference to FIGS. 10A and 10B. A device according to the present exemplary embodiment is applicable to an apparatus including the same configuration as the first exemplary embodiment (FIGS. 2 to 4). FIGS. 10A and 10B each illustrate behavior of the illumination light and the synthetic diffracted light according to the third exemplary embodiment. The rays of illumination light 100 and 101 pass through the diffraction grating 41 on the mold 7, and the light reflected in the diffraction order m by the diffraction grating 42 on the wafer 8 is diffracted in n-th order by the diffraction grating 41 on the mold 7, and the diffracted light enters the detection area NAo of the detection optical system 21. In FIGS. 10A and 10B, only components of the light that enters the detection optical system 21 to contribute to formation of the moiré pattern is illustrated among the rays of synthetic diffracted light generated by the illumination light 100 from the first pole Il1 and the illumination light 101 from the second pole IL2. Synthetic diffracted light 130 is specified by (m, n)=(1, 0), synthetic diffracted light 131 is specified by (m, n)=(2, −1), and the synthetic diffracted light 130 and the synthetic diffracted light 131 forms the first moiré pattern through interference. Synthetic diffracted light 132 is specified by (m, n)=(−1, 0), synthetic diffracted light 133 is specified by (m, n)=(−2, 1), and the synthetic diffracted light 132 and the synthetic diffracted light 133 forms the second moiré pattern through interference. The first and second moiré patterns each have the same period, the moiré pattern signal is obtained through addition of the first and second moiré patterns, and thus the relative positions of the alignment mark 10 on the mold 7 and the alignment mark 11 on the wafer 8 can be measured.

When the above-described synthetic diffracted light is used, excessive light becoming noise can be effectively removed because the diffracted light of m=0th order (direct reflected light) from the diffraction grating on the wafer is not used. This makes it possible to suppress the bias component of the moiré pattern detected by the detection optical system 21.

For the diffraction grating on the wafer, the diffracted light of m=1st order and the diffracted light of m=2nd order, or the diffracted light of m=−1st order and the diffracted light of m=−2nd order is used. Accordingly, amplitudes of the diffracted light are different from each other. The amplitude of the diffracted light is generally reduced as the diffraction order becomes high. Therefore, the pattern enhancing the diffraction efficiency of the higher-order diffracted light is desirable. A method of increasing the amplitude of the higher-order diffracted light includes the above-described segmentation of the pattern.

As the illumination condition, the pupil intensity distribution of the illumination optical system 22 of the measurement optical system 3 illustrated in FIG. 6 and FIG. 7 is usable as with the first exemplary embodiment.

When the pitch of the alignment mark 10 on the mold 7 is denoted by P1 and the pitch of the alignment mark 11 on the wafer 8 is denoted by P2, the period of the moiré pattern is expressed by P1×P2/|P1−P2|. Therefore, the moiré pattern is enlarged and shifted by P2/|P1−P2| with respect to the shift amount of the alignment mark 10.

A specific configuration according to a third exemplary embodiment is described. The pitch P1 of the diffraction grating 41 on the mold 7 is set to 2.8 µm, and the pitch P2 of the diffraction grating 42 on the wafer 8 is set to 3.8 µm. The period of the moiré pattern formed by interference of the synthetic diffracted light specified by (m, n)=(1, 0) and (m, n)=(2, −1) becomes P1×P2/|P1−P2|=10.64 µm. In this case, if the diffraction grating on the wafer is shifted by 1 µm, the moiré pattern is shifted by 2.8 µm. Therefore, the amount of the positional deviation of the diffraction grating on the wafer can be measured with accuracy of 2.8 times.

The numerical aperture NA of the detection optical system 21 is set to 0.07, the illumination light incident angle of the pupil intensity distribution (poles IL1 to IL4) of the illumination optical system 22 is set to 8.6 degrees (corresponding to NA of 0.15), and the wavelength λ of the illumination light is set to 0.7 µm. Under this condition, the 0th order diffracted light specified by (m, n)=(0, 0) is not detected because the light is radiated to the outside of the detection area of the detection optical system 21. On the other hand, the synthetic diffracted light 130, the synthetic diffracted light 131, the synthetic diffracted light 132, and the synthetic diffracted light 133 illustrated in FIGS. 10A and 10B are all guided to the detection optical system 21 and contribute to formation of the moiré pattern.

As the method of selecting the diffraction orders, there are various combinations in addition to those described in the above-described three exemplary embodiments. The disclosure is widely applicable to the various combinations.

<Method of Manufacturing Article>

Next, a method of manufacturing articles (e.g., semiconductor integrated circuit (IC) devices, liquid crystal display devices, color filters, and microelectromechanical systems (MEMS)) with use of the above-described imprint apparatus is described. First, the mold is brought into contact with an imprint material on a substrate (e.g., wafer or glass substrate) by the above-described imprint apparatus, the substrate and the mold is aligned, and the imprint material is cured. Further, etching is performed using the pattern of the cured imprint material as a mask and the other well-known processing is performed, which results in an article. The other well-known processing includes exfoliation of the imprint material, dicing, bonding, and packaging. According to the present manufacturing method, it is possible to manufacture an article with higher quality than the article by the existing manufacturing method.

As described above, according to the exemplary embodiments, it is possible to detect the moiré pattern formed by the plurality of diffraction gratings with high accuracy. Although the mold having the concave-convex pattern has been described, a thin plate-like mold not provided with the concave-convex pattern is also usable. The thin plate-like mold is used in a molding apparatus (planarization apparatus) that presses a composition on a substrate by the mold to planarize the composition. In a case where the planarization apparatus is used, the plate-like mold is brought into contact with the composition, the composition is cured, and the mold is released from the composition to planarize the composition. Further, the pattern is formed on the substrate including the planarized composition to manufacture an article from the substrate provided with the pattern.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-104910, filed May 31, 2018, which is hereby incorporated by reference herein in its entirety.

What is claimed is:

1. A detection device, comprising:
   an illumination optical system configured to illuminate a first one-dimensional diffraction grating having a period in a first direction and a second one-dimensional diffraction grating having a period different from the period of the first diffraction grating in the first direction; and
   a detection optical system configured to detect light diffracted by the first diffraction grating and the second diffraction grating,
   wherein the illumination optical system includes an optical member configured to form, on a pupil plane, a first pole and a second pole that is located on a side opposite to the first pole with respect to an optical axis, and
   wherein the illumination optical system causes light from the first pole and light from the second pole to obliquely be incident on the first diffraction grating and the second diffraction grating from the first direction to illuminate the first diffraction grating and the second diffraction grating, and the detection optical system detects diffracted light that has been diffracted by one of the first diffraction grating and the second diffraction grating and further diffracted by an other one of the first diffraction grating and the second diffraction grating.

2. The detection device according to claim 1, wherein the detection device determines relative positions of the first diffraction grating and the second diffraction grating in the first direction based on the detected diffracted light.

3. The detection device according to claim 1, wherein the first pole and the second pole are symmetrical to the optical axis.

4. The detection device according to claim 1, wherein each of the first pole and the second pole includes a peak of light intensity distribution in the first direction.

5. The detection device according to claim 1, wherein the detection optical system detects a moiré pattern generated by the diffracted light diffracted by the first diffraction grating and the second diffraction grating.

6. The detection device according to claim 1, wherein the optical member is an aperture stop.

7. The detection device according to claim 1, wherein the detection optical system detects light intensity distribution obtained by synthesizing an interference pattern derived from interference between diffracted light that has been diffracted in m1-th order by the first diffraction grating and diffracted in n1-th order by the second diffraction grating and diffracted light that has been diffracted in m2-th order by the first diffraction grating and diffracted in n2-th order by the second diffraction grating, both of which are generated by illumination from the first pole, and an interference pattern derived from interference between diffracted light that has been diffracted in −m1-th order by the first diffraction grating and diffracted in −n1-th order by the second diffraction grating and diffracted light that has been diffracted in −m2-th order by the first diffraction grating and in −n2-th order by the second diffraction grating, both of which are generated by illumination from the second pole, where m1, n1, m2, and n2 are integers, a sign of a diffraction order on one side is positive, and a sign on another side is negative with respect to 0th order light.

8. The detection device according to claim 7, wherein the detection optical system detects light intensity distribution obtained by synthesizing an interference pattern derived from interference between diffracted light that has been diffracted in 1st order by the first diffraction grating and diffracted in 0th order by the second diffraction grating and diffracted light that has been diffracted in 0th order by the first diffraction grating and diffracted in 1st order by the second diffraction grating, both of which are generated by illumination from the first pole, and an interference pattern derived from interference between diffracted light that has been diffracted in −1st order by the first diffraction grating and diffracted in 0th order by the second diffraction grating and diffracted light that has been diffracted in 0th order by the first diffraction grating and diffracted in −1st order by the second diffraction grating, both of which are generated by illumination from the second pole.

9. The detection device according to claim 7, wherein the detection optical system detects light intensity distribution obtained by synthesizing an interference pattern derived from interference between diffracted light that has been diffracted in 2nd order by the first diffraction grating and diffracted in −1st order by the second diffraction grating and diffracted light that has been diffracted in 0th order by the first diffraction grating and diffracted in 1st order by the second diffraction grating, both of which are generated by illumination from the first pole, and an interference pattern derived from interference between diffracted light that has been diffracted in −2nd order by the first diffraction grating and diffracted in 1st order by the second diffraction grating and diffracted light that has been diffracted in 0th order by the first diffraction grating and diffracted in −1st order by the second diffraction grating, both of which are generated by illumination from the second pole.

10. The detection device according to claim 7, wherein the detection optical system detects light intensity distribution obtained by synthesizing an interference pattern derived from interference between diffracted light that has been diffracted in 2nd order by the first diffraction grating and diffracted in −1st order by the second diffraction grating and diffracted light that has been diffracted in 1st order by the first diffraction grating and diffracted in 0th order by the second diffraction grating, both of which are generated by illumination from the first pole, and an interference pattern derived from interference between diffracted light that has been diffracted in −2nd order by the first diffraction grating and diffracted in 1st order by the second diffraction grating and diffracted light that has been diffracted in −1st order by the first diffraction grating and in 0th order by the second diffraction grating, both of which are generated by illumination from the second pole.

11. The detection device according to claim 1, wherein the first diffraction grating or the second diffraction grating includes a segmented part.

12. An imprint apparatus that forms a pattern on a substrate with use of a mold, the imprint apparatus comprising:
the detection device according to claim 1; and
a control unit configured to control alignment of the mold and the substrate based on a result of detection by the detection device,
wherein the detection optical system of the detection device detects diffracted light that has been diffracted by the first diffraction grating provided on the mold and diffracted by the second diffraction grating provided on the substrate.

13. A planarization apparatus that brings a mold into contact with a composition on a substrate and cures the composition to planarize the composition, the planarization apparatus comprising:
the detection device according to claim 1; and
a control unit configured to control alignment of the mold and the substrate based on a result of detection by the detection device,
wherein the detection optical system of the detection device detects diffracted light that has been diffracted by the first diffraction grating provided on the mold and diffracted by the second diffraction grating provided on the substrate.

14. A detection method, comprising:
illuminating, by using an illumination optical system, a first one-dimensional diffraction grating having a period in a first direction and a second one-dimensional diffraction grating having a period different from the period of the first diffraction grating in the first direction; and
detecting diffracted light diffracted by the first diffraction grating and the second diffraction grating,
wherein the first diffraction grating and the second diffraction grating are illuminated by causing light from a first pole formed on a pupil plane of the illumination optical system and light from a second pole on a side opposite to the first pole with respect to an optical axis, to obliquely be incident on the first diffraction grating and the second diffraction grating, and wherein diffracted light that has been diffracted by one of the first diffraction grating and the second diffraction grating illuminated with the light from the first pole and the light from the second pole, and further diffracted by the other diffraction grating is detected.

15. The detection method according to claim 14, wherein a wavelength of the light from the first pole and a wavelength of the light from the second pole are selected to make intensity of the diffracted light from the first diffraction grating and intensity of the diffracted light from the second diffraction grating equal to each other.

16. The detection method according to claim 14, wherein the first diffraction grating or the second diffraction grating is segmented to make intensity of the diffracted light from the first diffraction grating and intensity of the diffracted light from the second diffraction grating equal to each other.

17. The detection method according to claim 14, wherein a duty of the first diffraction grating or the second diffraction grating is adjusted to make intensity of the diffracted light from the first diffraction grating and intensity of the diffracted light from the second diffraction grating equal to each other.

18. The detection method according to claim 14, wherein the period of the first diffraction grating or the second diffraction grating is set to 1/m to detect m-th order diffracted light from the first diffraction grating or the second diffraction grating, where m is an integer.

19. An article manufacturing method, comprising:
determining relative positions, in a first direction, of a first diffraction grating provided on a mold and a second diffraction grating provided on a substrate based on diffracted light detected by the detection method according to claim 13;
aligning the mold and the substrate based on the determined relative positions;
bringing the aligned mold into contact with a composition on the aligned substrate to cure the composition; and
manufacturing an article from the substrate including the cured composition.

* * * * *